United States Patent
Nakao et al.

(12)

(10) Patent No.: US 6,797,443 B2
(45) Date of Patent: Sep. 28, 2004

(54) FOCUS MONITORING METHOD, FOCUS MONITORING APPARATUS, AND METHOD OF MANUFACTURING SEMICONDUCTOR DEVICE

(75) Inventors: Shuji Nakao, Hyogo (JP); Yuki Miyamoto, Hyogo (JP); Naohisa Tamada, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 29 days.

(21) Appl. No.: 09/986,084

(22) Filed: Nov. 7, 2001

(65) Prior Publication Data

US 2002/0195539 A1 Dec. 26, 2002

(30) Foreign Application Priority Data

Jun. 25, 2001 (JP) ........................................ 2001-191757

(51) Int. Cl.⁷ .................................................. G03F 9/00
(52) U.S. Cl. .......................................... 430/30; 430/22
(58) Field of Search ...................... 430/22, 30; 356/400

(56) References Cited

U.S. PATENT DOCUMENTS 5,952,132 A * 9/1999 King et al. .................. 430/22

FOREIGN PATENT DOCUMENTS

JP 2-310912 12/1990
KR 1999-0034790 5/1999

OTHER PUBLICATIONS

Shuji Nakao, et al., "Development of Focus Monitor by Eccentric Illumination Aperture," published Mar. 28, 2001, p. 733 of Extended Abstracts (the 48$^{th}$ Spring Meeting, 2001), The Japan Society of Applied Physics and Related Societies.*

* cited by examiner

Primary Examiner—Christopher G. Young
(74) Attorney, Agent, or Firm—McDermott Will & Emery LLP

(57) ABSTRACT

Non-telecentric illuminating light obtained by controlling the shape of an opening of an illumination aperture is directed onto a photomask, and a characteristic such that an image of a pattern of the photomask formed by the non-telecentric illumination moves in the direction perpendicular to an optical axis when an image-forming plane is moved in the direction of the optical axis, to perform focus monitoring. This eliminates the need for a special photomask, so that inexpensive and highly precise focus monitoring method, focus monitoring apparatus, and a method of manufacturing a semiconductor device can be obtained.

9 Claims, 17 Drawing Sheets

Z DIRECTION

X-Y DIRECTION

FIRST EXPOSURE
(DECENTERED ILLUMINATION)

SECOND EXPOSURE
(NORMAL ILLUMINATION)

DECENTERED ILLUMINATION

NORMAL ILLUMINATION

MOVEMENT OF DARKLINE ACCORDING TO FOCUS,
MASK(Cr0.1 μm, SHIFTER90° 50μm), NA0.68, σ0.30

FOCUS MONITORING METHOD, FOCUS MONITORING APPARATUS, AND METHOD OF MANUFACTURING SEMICONDUCTOR DEVICE

BACKGROUND OF THE INVENTION

1. Field of the Invention

The present invention relates to a focus monitoring method, a focus monitoring apparatus and a method of manufacturing a semiconductor device, and more particularly, to a focus monitoring method used for pattern formation of a semiconductor device, a focus monitoring apparatus, and a method of manufacturing a semiconductor device.

2. Description of the Background Art

In recent years, high integration and miniaturization of semiconductor integrated circuits have been remarkable. Accordingly, miniaturization of a circuit pattern formed on a semiconductor substrate (hereinafter simply referred to as a wafer) has rapidly been advanced.

Among others, a photolithography technique is widely recognized as a basic technique in pattern formation. Thus, up to the present date, various developments and improvements have been made to the photolithography technique. However, patterns have continuously been reduced in size, and also the demand for improvement of pattern resolution is becoming stronger.

The photolithography technique is a technique in which a pattern on a photomask (an original) is transferred onto a photoresist applied on a wafer and the photoresist having the transferred pattern is used to pattern an underlayer film to be etched.

The photoresist is subjected to a developing process at the time of transferring the pattern onto the photoresist. A type of a photoresist in which a portion of the photoresist exposed to the light is removed in the developing process is referred to as a positive type photoresist, whereas a type in which a portion of the photoresist unexposed to the light is removed is referred to as a negative type photoresist.

In general, a limit of resolution R (nm) in the photolithography technique using a reduction exposure method is represented by $$R = k_1 \cdot \lambda / (NA)$$

wherein $\lambda$ is an optical wavelength (nm) used, NA is a numeral aperture of a projection optical system of a lens, and $k_1$ is a constant depending on a resist process and image-forming condition.

As can be seen from the equation above, a possible way to improve the limit of resolution R, i.e. to obtain a microscopic pattern, is to make the values of $k_1$ and $\lambda$ smaller and to make the value of NA larger. That is, the constant depending on the resist process may be made lower while the wavelength is shortened and the NA is made higher.

However, problems arise in that it is technically difficult to improve a light source and a lens, and that the shorter wavelength and the higher NA may make the depth of focus $\delta$ of light ($\delta = k_2 \cdot \lambda / (NA)^2$) shallower, resulting in lower resolution on the contrary.

In order to expose the pattern of the photomask onto the photoresist with high resolution in such a lithography technique, exposure must be carried out in the state where the photoresist is adjusted to the best image-forming plane, i.e. the best focus plane, of the projection optical system within a range of the depth of focus. For that purpose, it is necessary to obtain, in some way, the position of the best focus plane, i.e. the best focus position, of the projection optical system.

An example of a conventional focus monitor for measuring the best focus position is a phase shift focus monitor developed by Brunner of IBM Corp. and sold by Benchmark Technologies, Inc. in the United States.

FIG. 19 illustrates a method of phase shift focus monitoring. Referring to FIG. 19, a phase shift mask 105 is used in the phase shift focus monitoring method. Phase shift mask 105 includes a transparent substrate 105a, a light-shielding film 105b having a predetermined pattern, and a phase shifter 105c formed on the predetermined pattern.

Specifically, as shown in FIG. 20, phase shift mask 105 has a pattern in which a narrow light-shielding pattern is arranged between substantially wide transmitting portions 105d and 105e. It is noted that no phase shifter 105c is arranged at transmitting portion 105d, whereas phase shifter 105c is arranged at transmitting portion 105e.

In the phase shift focus monitoring method, light is directed onto phase shift mask 105. At that moment, phase shifter 105c is configured such that the phase of the transmission light is shifted 90°, and thus, when the light transmitted through transmitting portion 105e is advanced compared to the light transmitted through transmitting portion 105b by the optical path difference of ¼ λ, ⅝ λ, . . . , or when it is delayed by ¾ λ, ⅞ λ, . . . , the both light beams intensify each other. This allows the light transmitted through phase shift mask 105 to have an asymmetric intensity distribution with respect to the z axis (the optical axis). The light transmitted through phase shift mask 105 is condensed by projection lens 119a, 119b, and forms an image onto a photoresist 121b on a semiconductor substrate 121a.

By the phase shift focus monitoring, an image is formed onto photoresist 121b in the state where the intensity distribution of diffracted light is asymmetric with respect to the z axis. Thus, as wafer 121 is moved in the z direction, a pattern image on wafer 121 is moved in the direction perpendicular to the z axis which is in the lengthwise direction in the drawing (the x-y direction, i.e. the crosswise direction in the drawing). Measurement of the amount of shift of the pattern image in the x-y direction enables measurement of a position in the z direction, i.e. measurement of a focus.

Another example of the focus monitoring method other than the phase shift focus monitoring is a method disclosed in Japanese Patent Laying-Open No. 6-120116. In this method, first, a predetermined pattern on the surface of a photomask is illuminated with exposure light having a main light beam at the first angle of inclination, to expose the first image of the predetermined pattern on a photosensitive substrate. Subsequently, the predetermined pattern is illuminated by exposure light having a main light beam at the second angle of inclination different from the first angle of inclination, to expose the photosensitive substrate to the second image of the predetermined pattern. The distance between the exposed first and second images is measured, and the relation between the measured distance and a defocused amount is used to obtain the distance from the position of the photosensitive substrate to the best focus plane.

In this method, a photomask 205 having a configuration as shown in FIG. 21 is used for illumination of the predetermined pattern on the photomask surface at the first angle of inclination or the second angle of inclination.

Referring to FIG. 21, photomask 205 includes a transparent substrate 205a, position measurement marks $205b_1$, $205b_2$ formed on the front surface of transparent substrate $205a$, a diffraction grating pattern $205c$ formed on the rear surface of transparent substrate $205a$. This means that the exposure light entered into photomask 205 is diffracted at diffraction grating pattern $205c$ to illuminate position measurement mark $205b_1$ at the first angle of inclination and to illuminate position measurement mark $205b_2$ at the second angle of inclination.

However, the phase shift focus monitoring described above requires the use of a phase shift mask having a special structure as photomask 105. There was a problem in that such a photomask with the special structure increased the cost of the photomask.

In addition, the method disclosed in Japanese Patent Laying-Open No. 6-120116 requires formation of microscopic diffraction grating pattern $205c$ on the rear surface of the photomask, requiring a number of steps. Thus, there was a disadvantage in that the manufacturing cost of the mask was increased to a large degree.

Moreover, by the current mask fabricating techniques, it is extremely difficult to form patterns, while the relative positional relationship of the patterns on both sides of the mask substrate is maintained to be precise. If the patterns on the both sides are out of a desired relative positional relationship, position measurement marks $205b_1$, $205b_2$ are not illuminated with diffracted light at a desired angle, making it difficult to accurately measure focus.

Furthermore, there was a disadvantage in that only a portion of the rear surface of photomask 205 where diffraction grating pattern $205c$ exists must be illuminated with the exposure light, requiring the illumination range to be within a restricted portion.

SUMMARY OF THE INVENTION

An object of the present invention is to provide a focus monitoring method and a focus monitoring apparatus enabling inexpensive and highly-precise focus monitoring, and a method of semiconductor device, by eliminating the need for a special photomask.

According to the present invention, a focus monitoring method used for pattern formation of a semiconductor device is characterized in that light is directed onto a photomask by non-telecentric illumination obtained by controlling a shape of an opening of an illumination aperture, and such a characteristic is utilized to perform focus monitoring that a pattern image of the photomask formed by the illumination is moved in a direction perpendicular to an optical axis when an image-forming plane is moved in a direction of the optical axis.

In the focus monitoring method according to the present invention, non-telecentric illuminating light is directed onto the focus monitor to express a characteristic in that the image of the photomask pattern moves in the direction perpendicular to the optical axis when the image-forming plane is moved in the direction of the optical axis. The non-telecentric illumination can readily be obtained by controlling the shape of the illumination aperture, eliminating the need for the use of a special structure for the photomask. This allows an inexpensive and highly precise focus monitor.

Preferably, in the focus monitoring method, a mark pattern of a box-in-box-in-box type having an outer box pattern and an inner box pattern is transferred onto a photoresist, and a relative displacement of the outer box pattern and the inner box pattern transferred onto the photoresist is detected, to perform focus monitoring.

By using the mark pattern of the box-in-box type, defocus can be detected from the displacement within the image-forming plane.

Preferably, in the focus monitoring method, the non-telecentric illumination is used for exposure of at least one of the outer box pattern and the inner box pattern.

Thus, occurrence of defocus causes displacement of pattern images within the image-forming plane, so that defocus can be detected.

Preferably, in the focus monitoring method, the non-telecentric illumination is used for exposure of both of the outer box pattern and the inner box pattern. A first illumination aperture having an opening only on one side of a meridian plane set as a border is used at the time of exposure of the outer box pattern, and a second illumination aperture having an opening only on the other side of the meridian plane set as a border is used at the time of exposure of the inner box pattern.

Thus, defocus causes movements of the image of the outer box pattern and the image of the inner box pattern in the opposite directions, thereby enhancing detectivity.

Preferably, in the focus monitoring method, for the first illumination aperture, one of a circular illumination apperture stop, an annular illumination apperture stop and a quadruple illumination apperture stop, with an opening left only on one side of the meridian plane set as a border, is used. For the second illumination aperture, one of a circular illumination apperture stop, an annular illumination apperture stop and a quadruple illumination apperture stop, with an opening left only on the other side of the meridian plane set as a border, is used.

Thus, various diaphragms can be used as an illumination aperture.

The focus monitoring method preferably includes a first exposure step exposing the photoresist to one of the outer box pattern and the inner box pattern, a second exposure step exposing the photoresist to the other one of the outer box pattern and the inner box pattern, and a development step developing the photoresist after the first and second exposure steps.

Thus, development is performed after double exposure, to form the mark pattern of box-in-box type.

Preferably, the focus monitoring method includes a first exposure step exposing the photoresist to one of the outer box pattern and the inner box pattern, a first development step developing the photoresist after the first exposure step, a second exposure step exposing the photoresist to the other one of the outer box pattern and the inner box pattern, and a second development step developing the photoresist after the second exposure step.

Thus, by repeating exposure and development twice each, the mark pattern of the box-in-box type can be formed.

According to the present invention, a focus monitoring apparatus used for pattern formation of a semiconductor device, including an illumination optical system illuminating a photomask on which a pattern is formed with exposure light, and a projection optical system projecting an image of the pattern of the photomask onto a photosensitive body. The image of the pattern of the photomask, formed by directing non-telecentric illuminating light obtained by controlling a shape of an opening of an illumination aperture included in the illumination optical system onto the photomask, is configured to move in a direction perpendicular to an optical axis when an image-forming plane is moved in a direction of the optical axis.

The focus monitoring apparatus according to the present invention is configured to express the characteristic such that illumination of the photomask with non-telecentric illuminating light allows the pattern image to be moved in the direction perpendicular to the optical axis when the image-forming plane is moved in the direction of the optical axis. The non-telecentric illumination can readily be obtained by controlling the shape of the opening of the illumination aperture, eliminating the need for using a special structure for the photomask. This enables an inexpensive and highly precise focus monitor.

According to the present invention, a method of a semiconductor device uses any one of the focus monitoring methods described above.

This eliminates the need for a special photomask, allowing an inexpensive and highly precise focus monitoring, so that an inexpensive and highly precise pattern can be formed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described below with reference to the drawings.

First Embodiment

Figure 1:
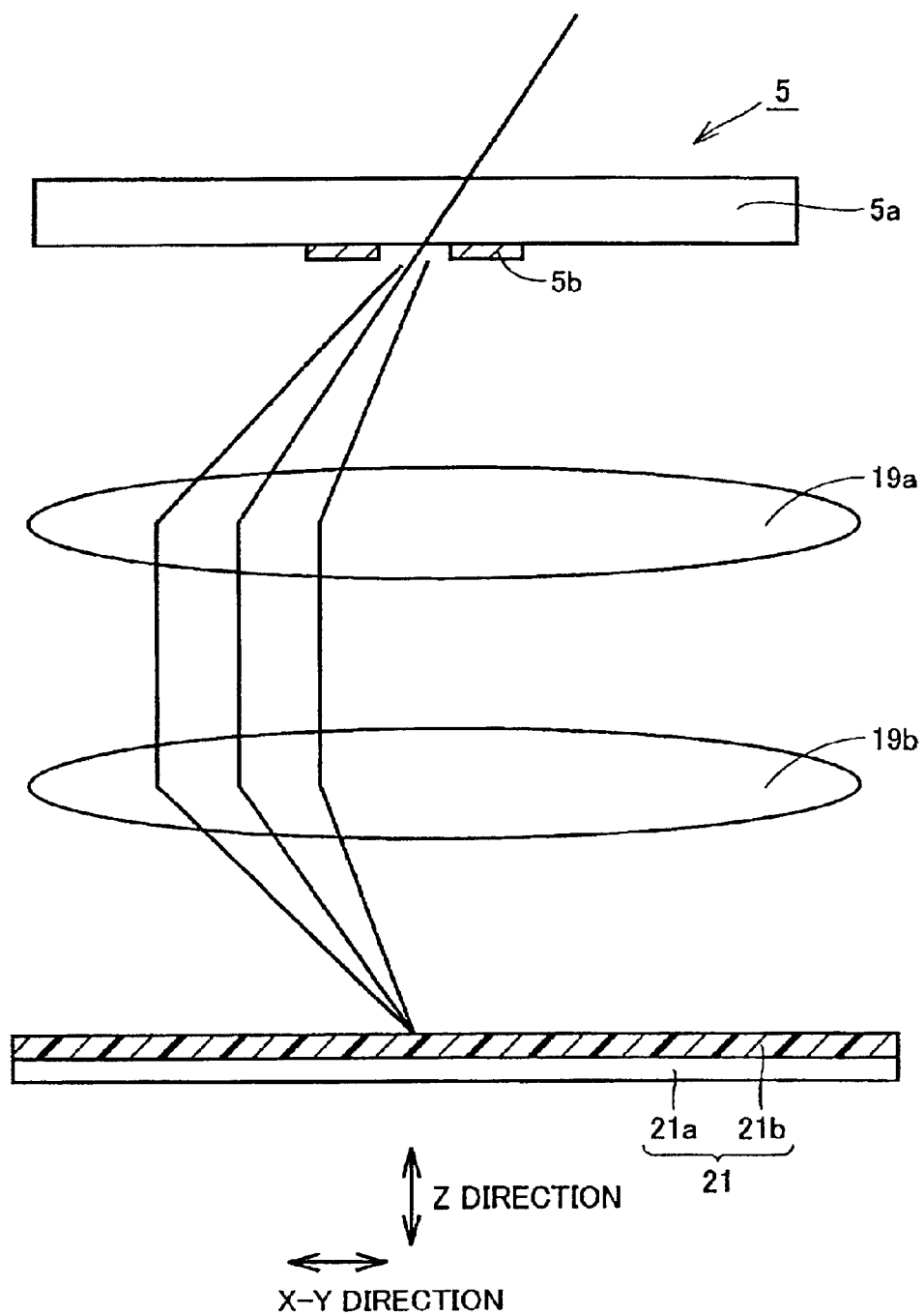
FIG. 1 is a schematic diagram illustrating a focus monitoring method according to the first embodiment of the present invention.

FIG. 1 shows the case where illuminating light enters from one diagonal direction for the purpose of simplification.

Referring to FIG. 1, non-telecentric illuminating light, e.g. illuminating light of which a main light beam is inclined with respect to an optical axis of an illumination optical system, enters into a photomask 5. The illuminating light diffracted by a pattern 5b of photomask 5 is condensed by projection lens 19a, 19b and forms an image onto a wafer 21.

As can be seen from the arrangement of the light beam on wafer 21, the pattern image on wafer 21 is formed by the illuminating light entering from the diagonal direction. Thus, as wafer 21 is moved in the z direction (the direction of the optical axis) to make the focal point of the pattern image out of focus, the pattern image also moves, simultaneously, in the lateral direction (the x-y direction) within the plane of wafer 21.

In a normal pattern transfer in a semiconductor device, illuminating light is formed by all means to be axisymmetric with respect to the direction of the optical axis in the illumination optical system and the projection optical system (considering one incident light beam, the light is formed such that a light beam symmetric thereto with respect to the axis always exists), so that lateral movement associated with such a movement of focus can be made substantially small.

The pattern image formed by the non-telecentric illumination is formed as a resist pattern on a photoresist 21b of wafer 21. Measurement of the relative positional relationship between this pattern and another pattern from an image formed by different illumination allows detection of defocus at the transfer of the pattern.

In the present application, "non-telecentric illumination" means illumination that is not telecentric illumination (concentric epi-illumination), and specifically, it means illumination in which the intensity distribution of illuminating light is asymmetric with respect to the optical axis of the illumination optical system (illumination in which the barycenter in the intensity distribution of the illuminating light is off the optical axis).

Figure 2:
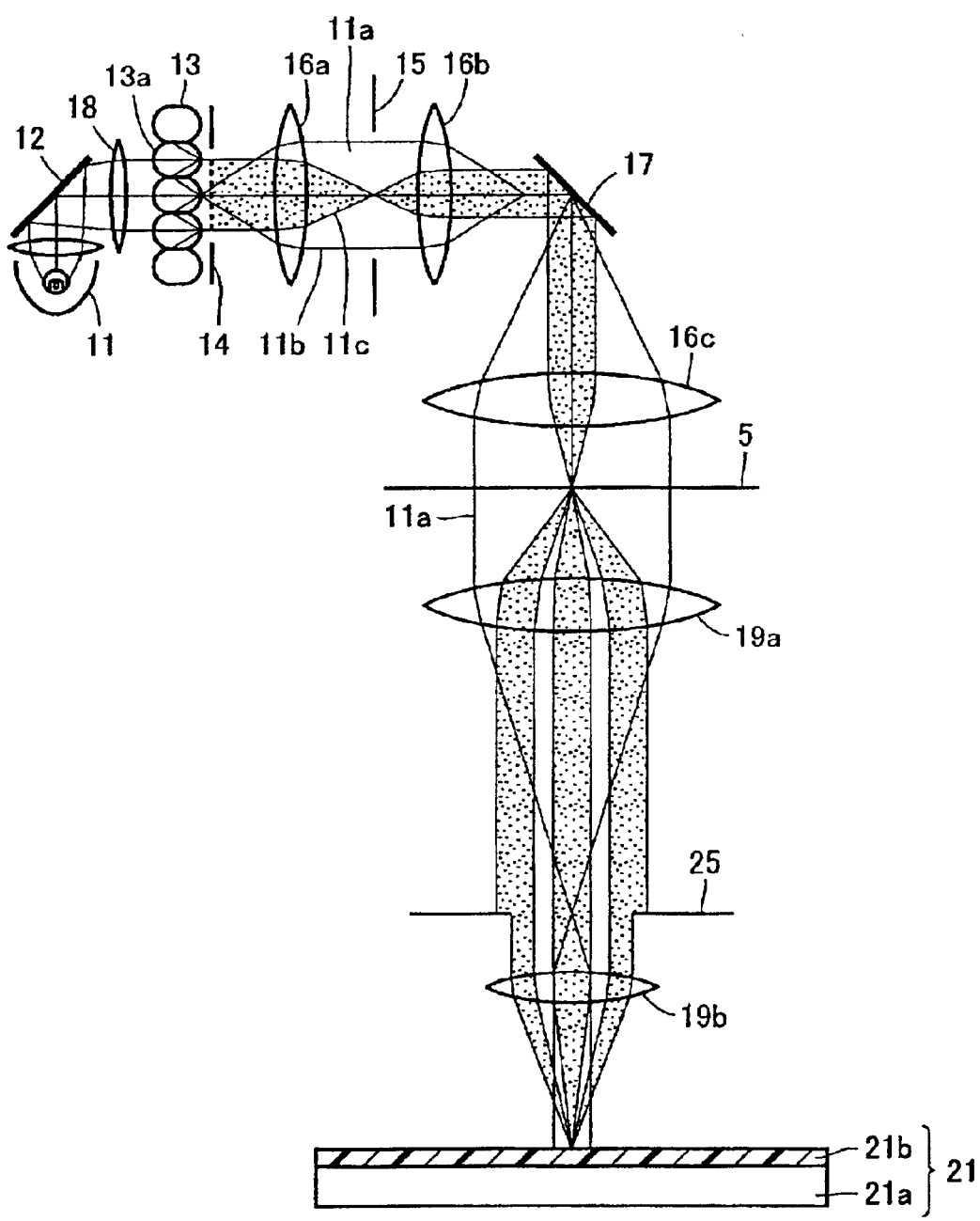
FIG. 2 schematically shows the configuration of a focus monitoring apparatus for effecting the focus monitoring method according to the first embodiment of the present invention.
Figure 3:
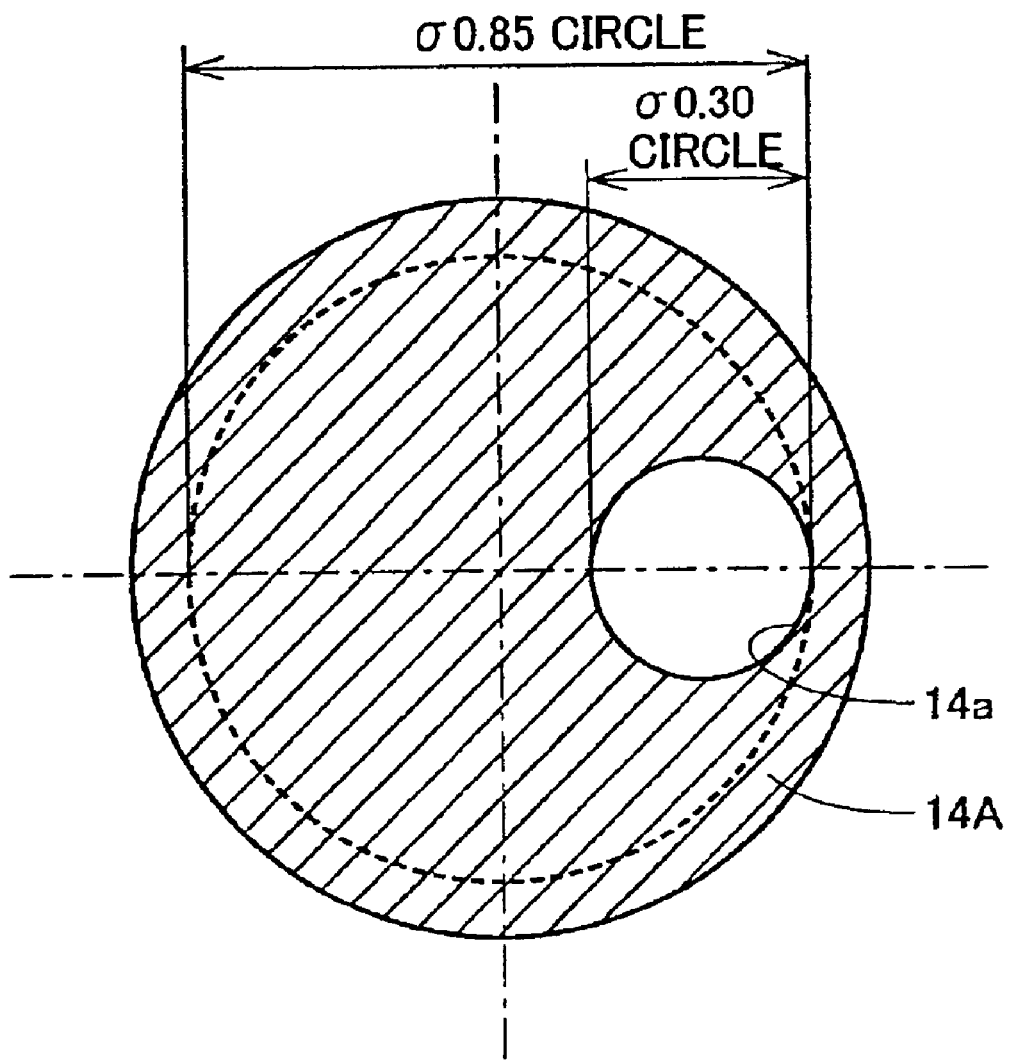
FIG. 3 is a plan view of an illumination aperture used in the focus monitoring apparatus shown in FIG. 2.

The focus monitoring method according to the present embodiment can be implemented by, for example, an apparatus shown in FIGS. 2 and 3.

Referring to FIG. 2, the focus monitoring apparatus has a configuration similar to a reduction projection exposure system (a stepper), in which a pattern on photomask 5 is reduced in size and is projected onto a photoresist (photosensitive body) 21b on the surface of wafer 21. The focus monitoring apparatus includes an illumination optical system from a light source 11 to a pattern on photomask 5, and a projection optical system from the pattern of photomask 5 to wafer 21.

The illumination optical system includes a mercury lamp 11 which is a light source, a reflector 12, a condensing lens 18, a fly-eye lens 13, a diaphragm 14, condensing lens 16a, 16b and 16c, a blind diaphragm 15, and a reflector 17. The projection optical system includes projection lens 19a and 19b, and an iris diaphragm 25.

In exposure operation, light 11a emitted from mercury lamp 11 reaches reflector 12 by which only the g line (wavelength: 436 nm) of light 11a is reflected, and comes to have a shorter wavelength. Next, light 11a passes through condensing lens 18 and enters into each of fly-eye component lens 13a constituting fly-eye lens 13, and thereafter passes through diaphragm 14.

Here, light 11b indicates an optical path generated by one of fly-eye component lens 13a, whereas light 11c indicates an optical path generated by fly-eye lens 13.

Light 11a passed through diaphragm 14 passes through condensing lens 16a, blind diaphragm 15 and condensing lens 16b, and is reflected by reflector 17 at a predetermined angle.

Light 11a reflected by reflector 17 passes through condensing lens 16c, and evenly irradiates the entire surface of photomask 5 on which a predetermined pattern is formed. Thereafter, light 11a is reduced to have a predetermined scale factor by projection lens 19a, 19b, and exposes photoresist 21b on semiconductor substrate 21a.

Referring to FIG. 3, in the focus monitoring apparatus described above, the shape of an opening 14a of an illumination aperture 14A provided on a secondary light-source plane of a stepper is designed to obtain non-telecentric illumination.

In order to carry out an exposure by a normal stepper in a practical exposure time period, the illumination aperture must be provided with an opening with a certain size or larger. Illumination aperture 14A in the present embodiment is provided with opening 14a having the size corresponding to σ(coherency)=0.3 with its center arranged on a circle of σ=0.55. A means for limiting the angle of incidence of the illuminating light within a certain range is not limited to the diaphragm shown in FIG. 14, but any form that can attain a similar effect may be used.

Now, the focus monitoring method according to the present embodiment is specifically described.

Figure 4:
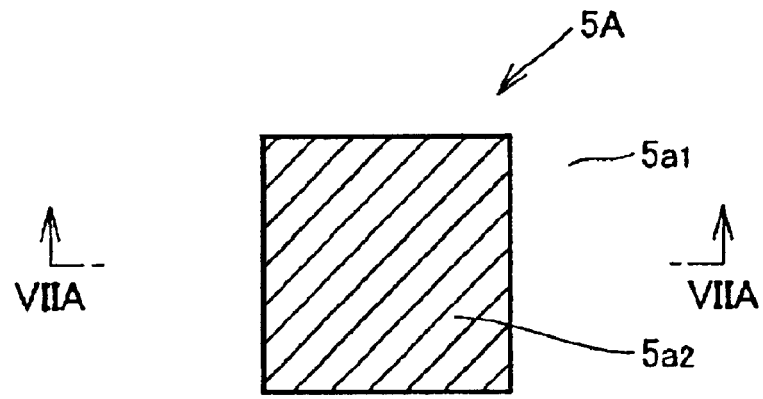
FIG. 4 is a plan view showing a pattern shape of a photomask used for the first exposure in the focus monitoring method according to the first embodiment of the present invention.
Figure 6A:
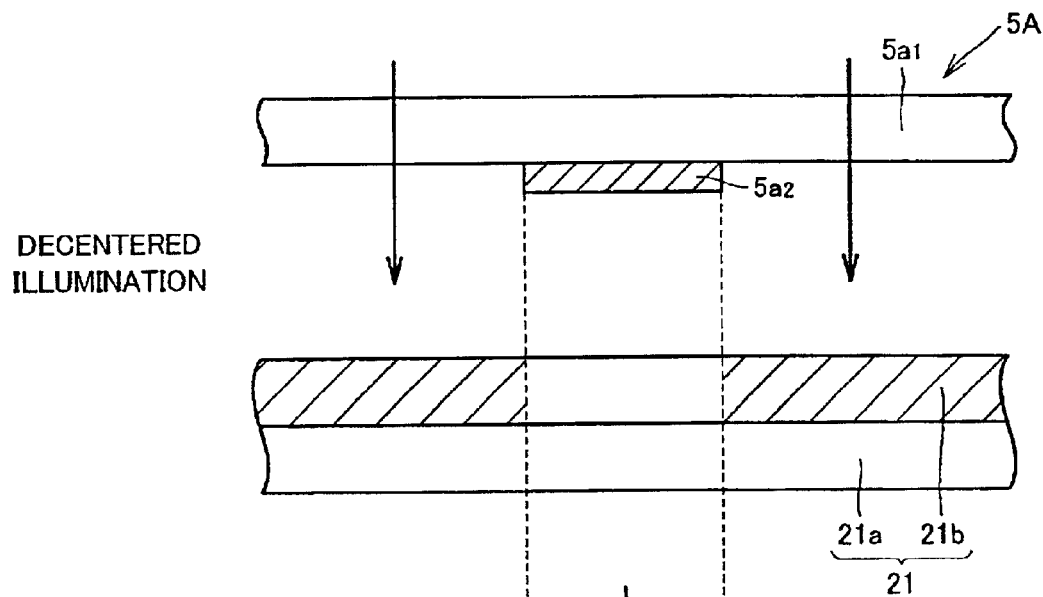
FIGS. 6A and 6B illustrate an exposure step in the focus monitoring method according to the first embodiment of the present invention.

In the focus monitoring method according to the present embodiment, two exposures are performed in order to form a mark pattern of a box-in-box type onto the photoresist. In the first exposure, as photomask 5 in FIG. 2, a photomask 5A having a light-shield pattern $5a_2$ of an approximate quadrangle on the surface of a transparent substrate $5a_1$ as shown in FIG. 4 is used, and photomask 5A is irradiated with non-telecentric illuminating light (decentered Illuminating light). By the first exposure, photoresist 21b is exposed except for the region corresponding to light-shield pattern $5a_2$, as shown in FIG. 6A.

Subsequently, the second exposure is carried out with illumination aperture 14A shown in FIG. 3 exchanged with a normal illumination aperture which is symmetric with respect to the optical axis, while wafer 21 is held in a wafer chuck (not shown) in FIG. 2. For the normal illumination aperture symmetric with respect to the optical axis, for example, an annular illumination apperture stop ($\sigma_{out}$=0.85, σin =0.57) is used in the present embodiment.

Figure 5:
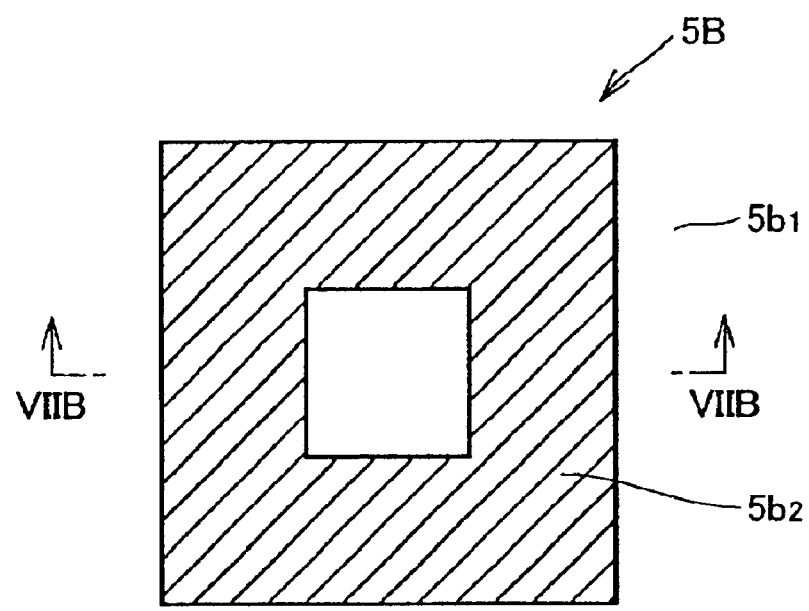
FIG. 5 is a plan view showing a pattern shape of a photomask used for the second exposure in the focus monitoring method according to the first embodiment of the present invention.
Figure 6B:
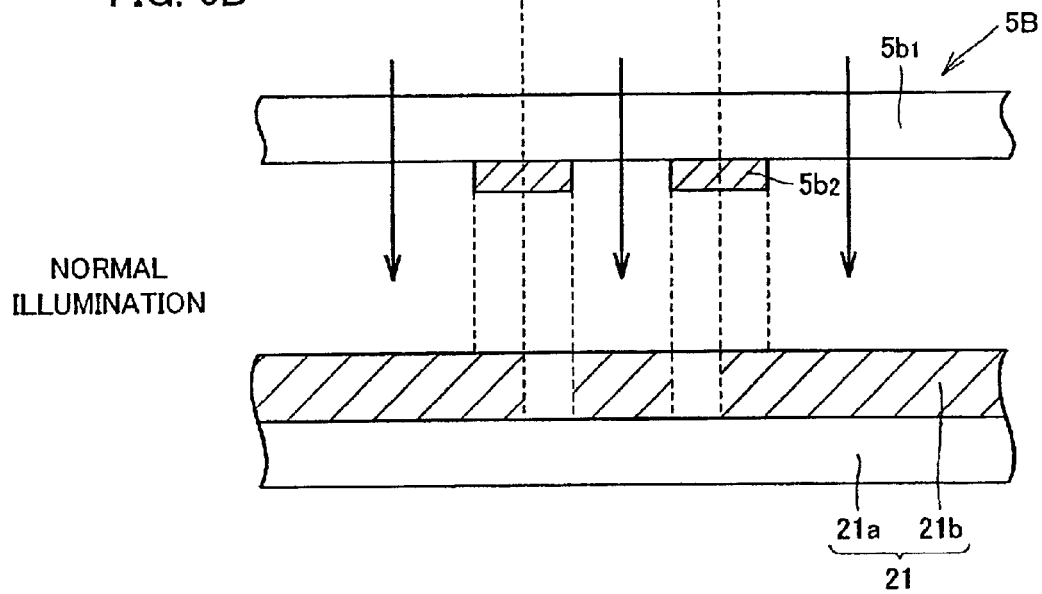

In the second exposure, as photomask 5 in FIG. 2, a photomask 5B having a light-shield pattern $5b_2$ with the shape of an approximate quadrangular frame on the surface of a transparent substrate $5b_1$ as shown in FIG. 5 is used, and photomask 5B is irradiated with normal illuminating light. The second exposure is carried out with an appropriate amount of exposure such that the centers of the first exposure pattern and the second exposure pattern agree with each other so as to accurately superpose the second exposure pattern on the first exposure pattern. By the second exposure, photoresist 21b is exposed except for the region corresponding to light-shield pattern $5b_2$ as shown in FIG. 6B.

Figure 7A:
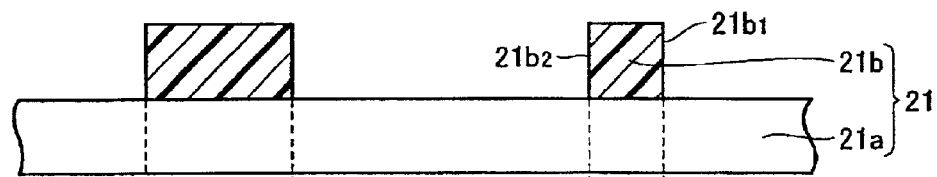
FIGS. 7A and 7B are section and plan views showing a resist pattern of a box-in-box type obtained by the focus monitoring method according to the first embodiment of the present invention.

Thereafter, photoresist 21b is developed. In the development, if photoresist 21b is a positive type, only the region irradiated with the exposure light is removed, and resist pattern 21b of the box-in-box type as shown in FIGS. 7A and 7B is formed.

Here, since the first exposure is performed by non-telecentric illumination, if there is defocus at the time of exposure, an outer box pattern $21b_1$ is moved within the x-y plane. On the other hand, the second exposure is performed by normal illumination, so that an inner box pattern $21b_2$ does not move within the x-y plane even if there is defocus at the time of exposure. Thus, when there is defocus, outer box pattern $21b_1$ is displaced (laterally moved) with respect to inner box pattern $21b_2$.

Figure 7B:
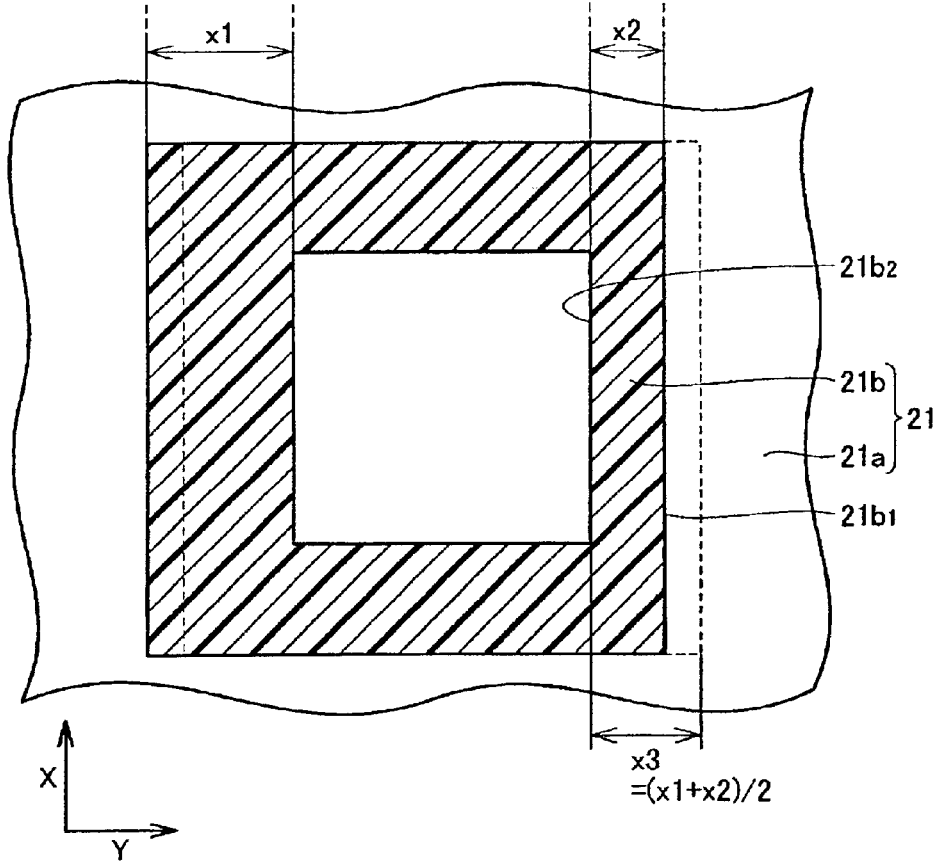

It is noted that the position of outer box pattern $21b_1$ at the best focus is indicated by a dotted line, whereas the position of outer box pattern $21b_1$ when there is defocus is indicated by a solid line in FIG. 7B.

Figure 8:
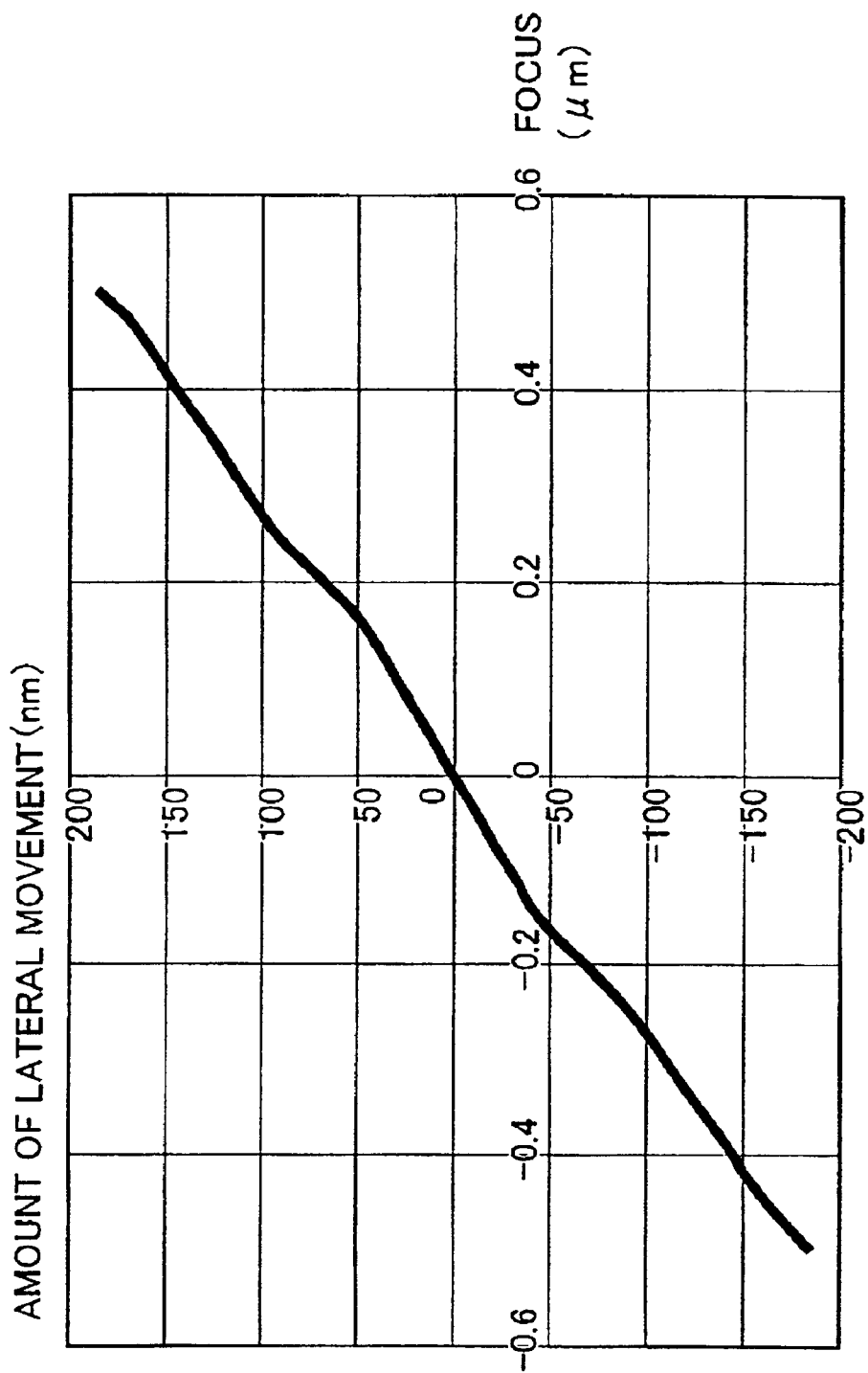
FIG. 8 shows a relation between focus and an amount of a lateral movement in the first exposure in the focus monitoring method according to the first embodiment of the present invention.

FIG. 8 shows the result obtained by an optical image calculation for the amount of lateral movement due to defocus of outer box pattern $21b_1$ formed by the first exposure using non-telecentric illumination. It can be found from FIG. 8 that the amount of lateral movement of outer box pattern $21b_1$ varies in an approximate linear manner with respect to the variation of the defocused amount.

Next, referring to FIGS. 7A and 7B, distances x1 and x2 between inner box pattern $21b_2$ and outer box pattern $21b_1$ are measured. From thus obtained values, a distance x3 (=(x1+x2)/2) between the inner box pattern and the outer box pattern at the best focus is obtained. The difference between distance x3 and distance x1 or x2 is obtained to find the amount of lateral movement (amount of displacement) of outer box pattern $21b_1$. The amount of lateral movement is considered in light of the relationship between the pre-measured amount of lateral movement and the focus as shown in FIG. 8, to allow detection of defocus. The best focus can be obtained by adjusting the position of wafer 21 based on the detected defocus.

Next, the detectivity is examined for the focus monitoring method in the present embodiment and for the conventional phase shift focus monitoring method. The result thereof is described below.

The measurement of the relative movement of the box patterns was performed by a commercially-available alignment inspection equipment. The inspection equipment allows measurement with repeatability of 2 nm.

First, in the focus monitoring method of the present embodiment, the first exposure was carried out at a plurality of intentionally-defocused field points of a commercially available scan stepper, and each of the plurality of field points was examined for how the amount of lateral movement of the pattern described above varies according to the defocus. The result thereof is shown in FIG. 9.

Figure 9:
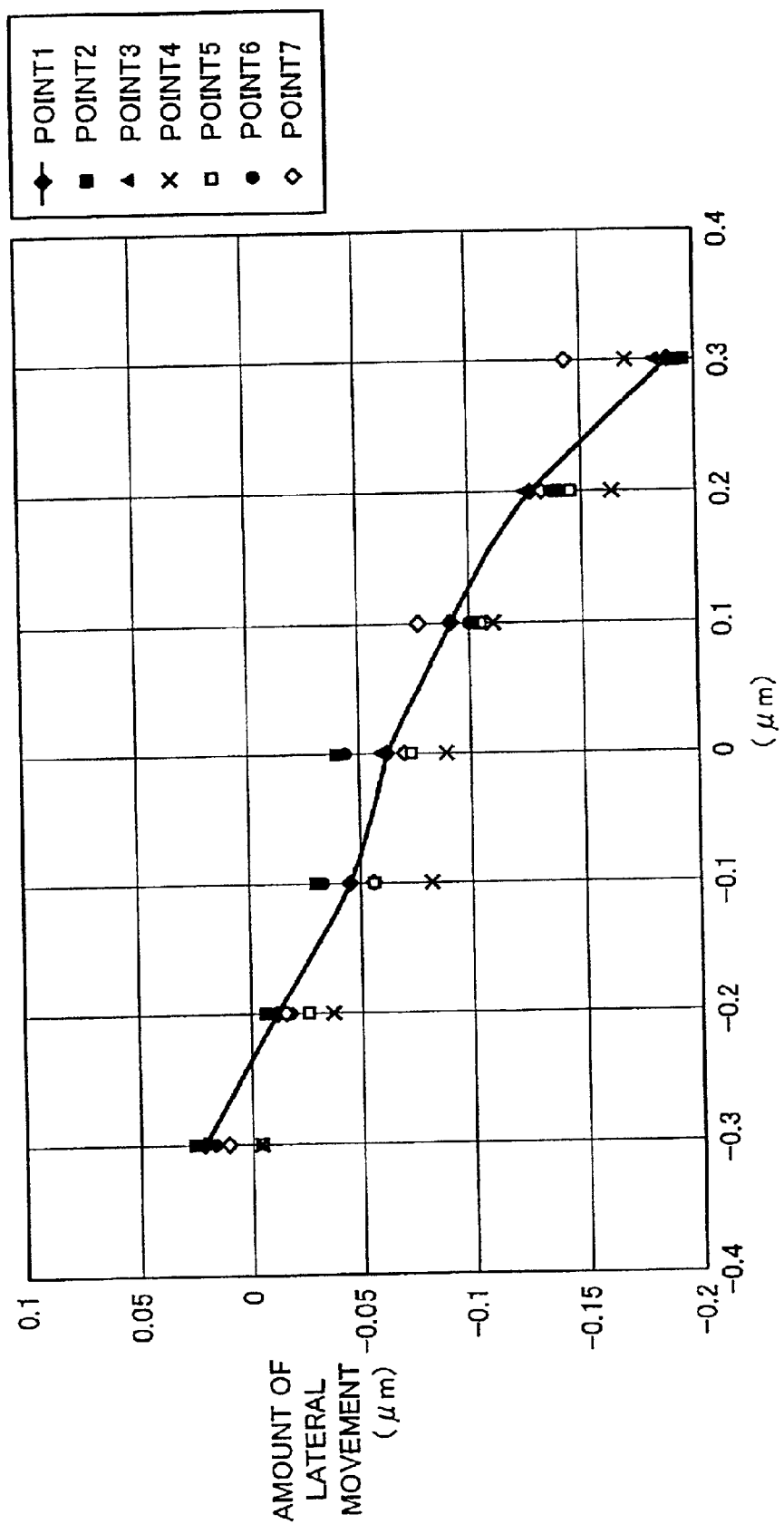
FIG. 9 shows a relation between a focus and an amount of a lateral movement in each field point.

It can be found from the result shown in FIG. 9 that characteristics obtained for each of field points 1 to 7 are much the same. The characteristics of the field points are not exactly the same because data of different focal points are obtained from different shots and the manner of irregularity on the surface of the wafer held in the wafer chuck is different for each shot. Thus, if the amount of lateral movement is measured for a plurality of shots with respect to the same focus and the measured results are averaged to cancel the effect of the irregularity on the wafer surface described above, the same characteristic can be obtained except for a certain amount of offset.

Figure 10:
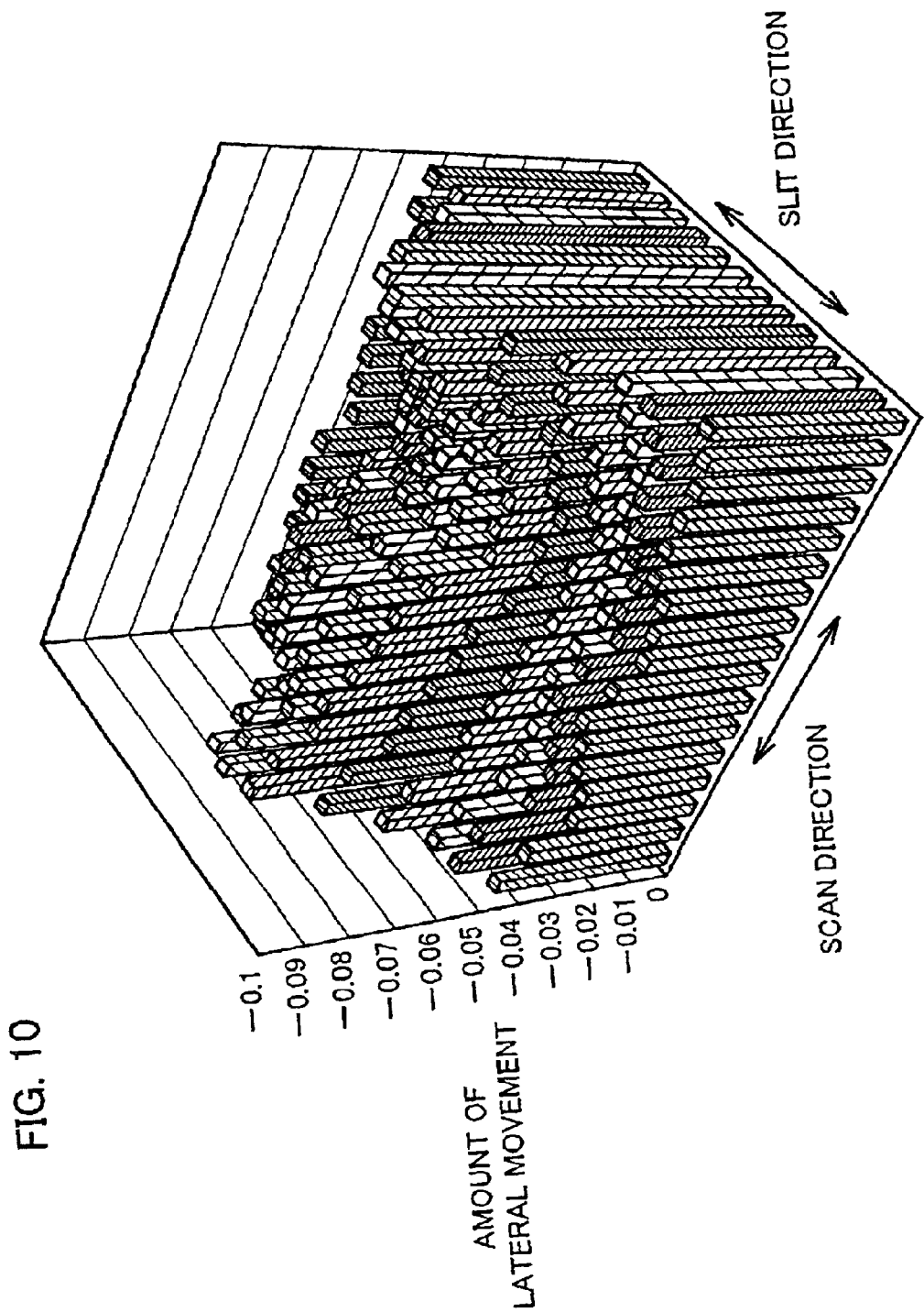
FIG. 10 shows the amount of the lateral movement in each field point.

Moreover, by the method according to the present embodiment, mark patterns of the box-in-box type are formed at the interval of 2 mm on a bare silicon wafer using a commercially available scan stepper, and the amount of lateral movement (amount of displacement) for each mark is measured. A three dimensional plot of the result is shown in FIG. 10. It can be observed from the result shown in FIG. 10 that the amount of lateral movement of a mark is within the range between −0.09 $\mu$m and −0.03 $\mu$m, and has a continuous distribution, though irregular, within an exposure shot.

Figure 11:
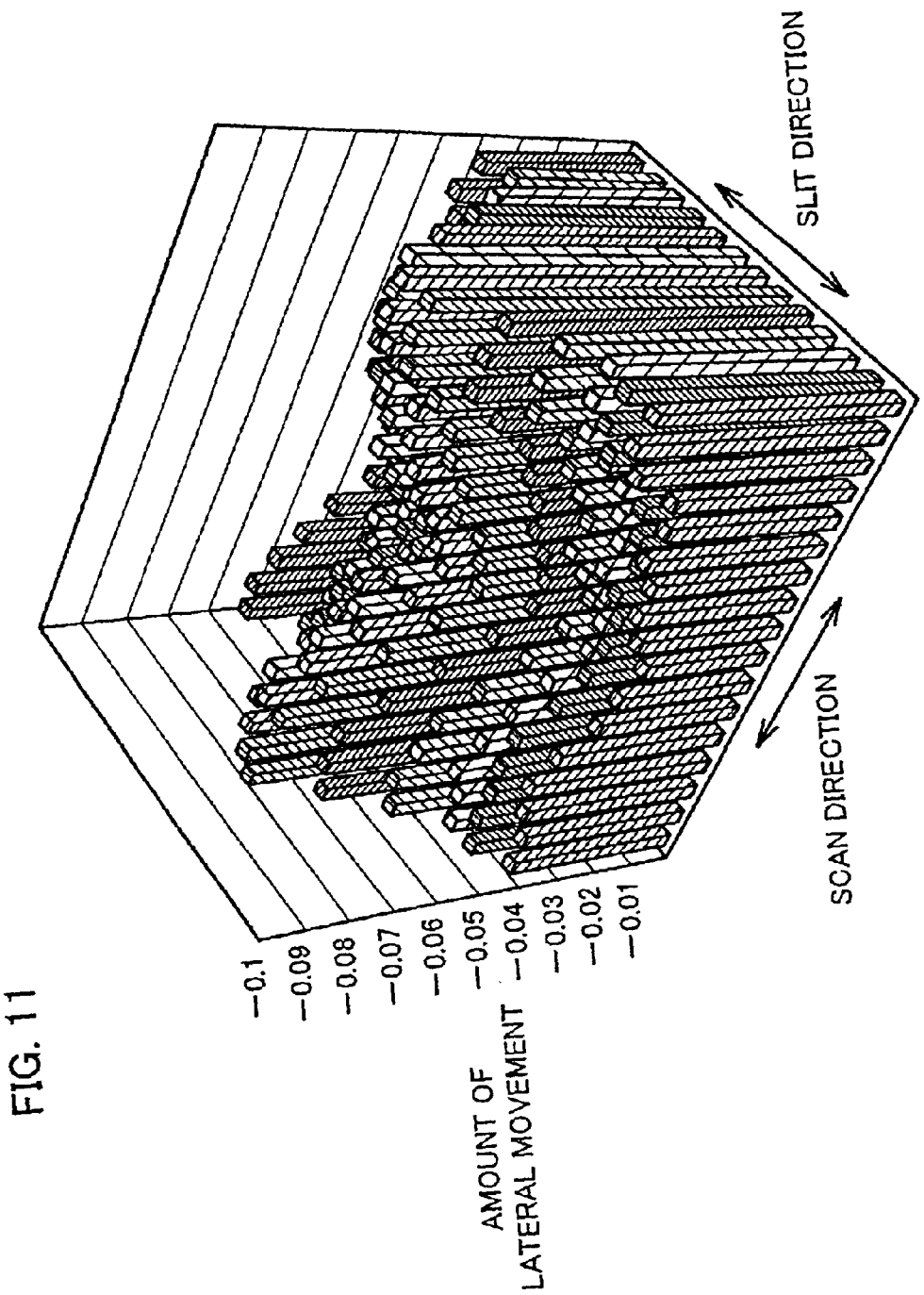
FIG. 11 shows the amount of the lateral movement in each field point, averaged for plurality of shots.

The measurement shown in FIG. 10 is performed for a plurality of shots and the measurement results are averaged as shown in FIG. 11. From the result shown in FIG. 11, a distribution is observed in that the amount of lateral movement of a mark is approximately constant in the scan direction whereas it is widely varied in the direction orthogonal to the scan direction (slit direction). This means that, by averaging a plurality of shots, the irregularity on the wafer surface that is random for each shot disappears and the distribution of focus, i.e. an image plane, is measured for the measurement mark formation by the present method.

The z detectivity ($\Delta x/\Delta z$) obtained from FIG. 9 is up to 25 nm/100 nm, and the range of the amount of lateral movement ($\Delta x$) obtained from FIG. 11 is up to 60 nm, so that the range of the image plane ($\Delta z$) of this measurement pattern formation can be found as up to 240 nm.

In addition, variation of the amount of lateral movement of a pattern with respect to focus, when the focus is intentionally defocused for exposure using a phase shift mask as in the conventional phase shift focus monitoring method, was examined.

It is noted that, in the measurement described above, a phase shift mask is used having a configuration in that a light-shield film formed of a chrome (Cr) film is interposed between two light transmission portions and one of the light transmission portions is provided with a phase shifter shifting the phase 900 whereas the other one of the light transmission portions is provided with no phase shifter. Each width of the two light transmission portions is set as 5.0 $\mu$m, while the width of the light-shield film is set as 0.1 $\mu$m. In the measurement, an image was formed under the optical condition that NA is 0.68 and $\sigma$ is 0.3. The result thereof is shown in FIG. 12.

Figure 12:
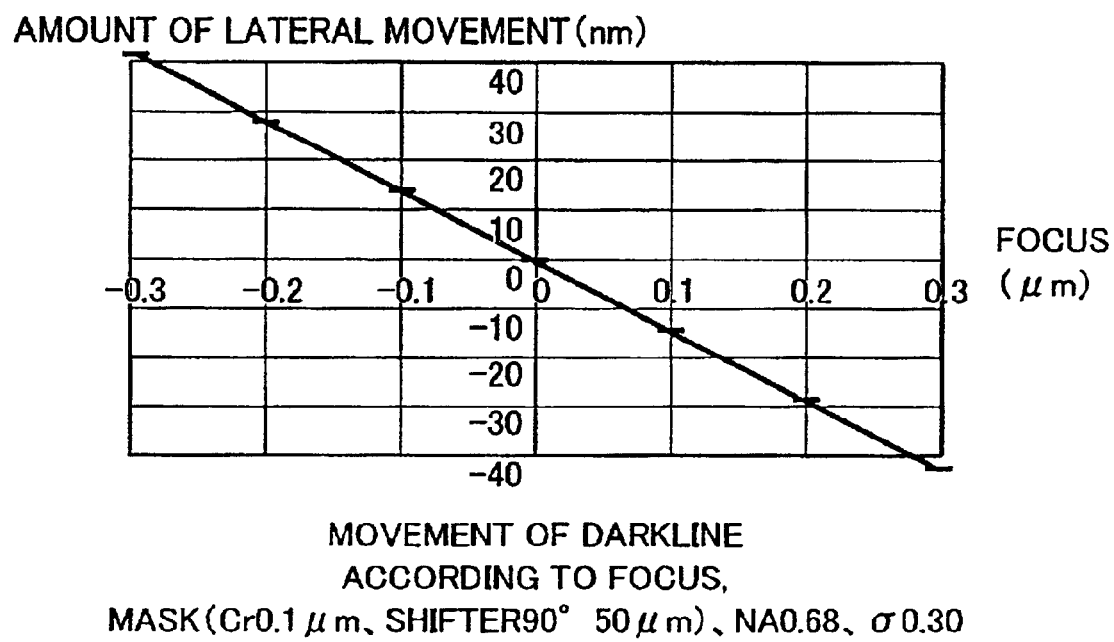
FIG. 12 shows movement of a dark line of a phase focus monitor according to focus.

The result shown in FIG. 12 indicates that the amount of lateral movement is up to 40 nm at 0.3 $\mu$m of defocus, and thus it can be found that the z detectivity ($\Delta x/\Delta z$) is up to 14 nm/100 $\mu$m. However, in case of an alignment inspection mark, a phase shifter is arranged such that a reference pattern moves in the direction opposite to the mark, so that the z detectivity will be twice as much as that described above, i.e. up to 30 nm/100 $\mu$m.

Thus, it is appreciated that the z detectivity equal to that in the conventional phase shift focus monitoring method can be obtained in the present embodiment.

Furthermore, in the present embodiment, unlike the conventional example, there is no need to use a photomask having a special shape, so that the focus monitoring can be carried out at low cost.

As has been described above, the focus monitoring method according to the present embodiment allows highly precise and inexpensive focus monitoring.

Second Embodiment

Figure 13:
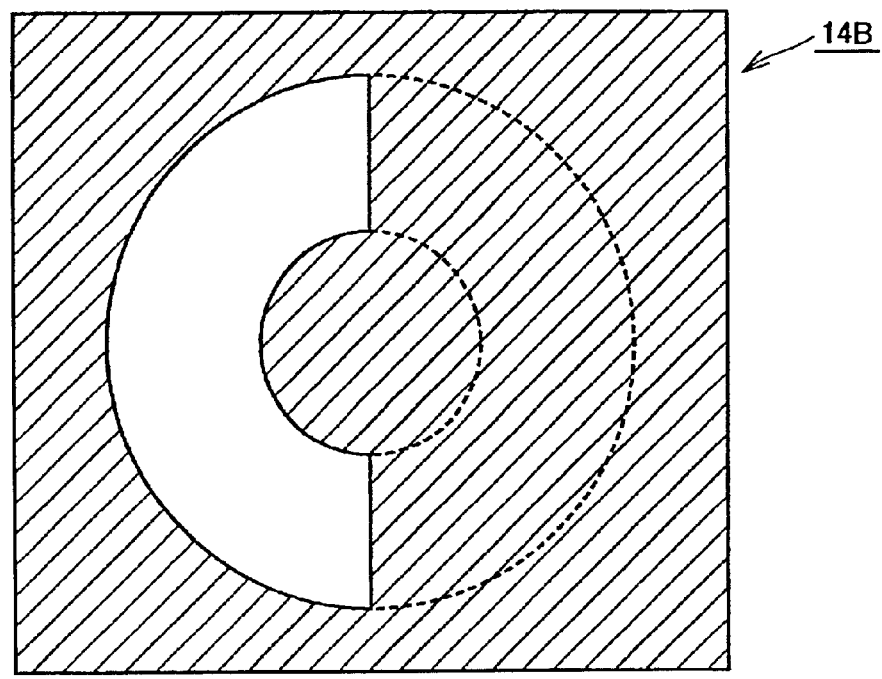
FIG. 13 shows the shape of an illumination aperture used in the first exposure in a focus monitoring method according to the second embodiment of the present invention.
Figure 14:
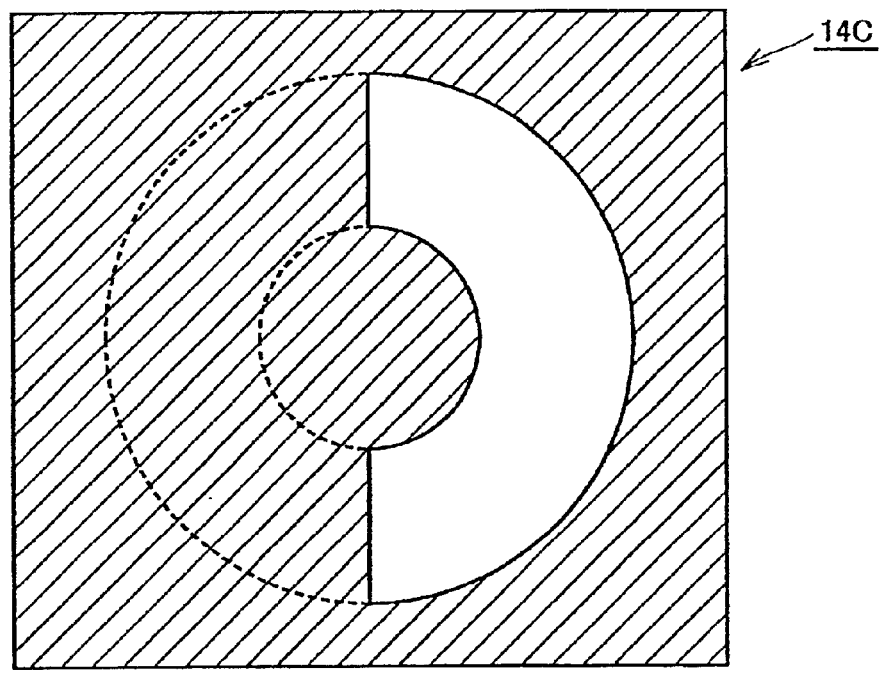
FIG. 14 shows the shape of an illumination aperture used in the second exposure in the focus monitoring method according to the second embodiment of the present invention.

In the present embodiment, the first exposure of the two exposures described in the first embodiment is carried out using a diaphragm 14B in which a half of an annular illumination apperture stop is concealed when the meridian plane is set as a border, as shown in FIG. 13. This allows the first exposure to be performed by non-telecentric illumination. Moreover, the second exposure is carried out using a diaphragm 14C in which the other half of the zonal illumination apperture stop is concealed when the meridian plane is as the border, as shown in FIG. 14. This allows the second exposure to be also performed by non-telecentric illumination.

The photoresist is developed after the two exposures to form a resist pattern of the box-in-box type. By measuring the relative movements of the outer box pattern and the inner box pattern of the box-in-box resist pattern, the best focus can be obtained as in the case with the first embodiment.

It is noted that other aspects of the focus monitoring method and the focus monitoring apparatus are almost the same as those described in the first embodiment, so that the description thereof will not be repeated.

In the present embodiment, the illuminating light used for the first exposure and the illuminating light used for the second exposure are symmetric to each other with respect to the axis, so that the outer box pattern and the inner box pattern move in the opposite directions with respect to the focus position. Therefore, in the present embodiment, the amount of relative displacement of the outer box pattern and the inner box pattern is twice as large as that in the first embodiment, so that the twice as much z detectivity can be obtained.

It is theoretically clear that the image plane of the measurement pattern in the present method is the image plane by the normal illumination. Thus, the irregularity on the wafer surface (including the image plane) obtained by the present method indicates inconsistency of the image plane and the wafer plane in the actual transfer, and therefore the data obtained is practically useful.

Figure 15:
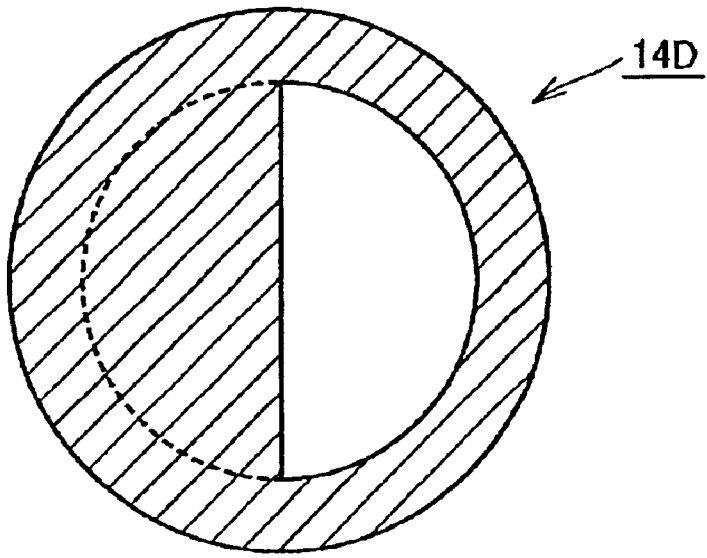
FIG. 15 shows the configuration of another illumination aperture used in the first exposure in the focus monitoring method according to the second embodiment of the present invention.
Figure 16:
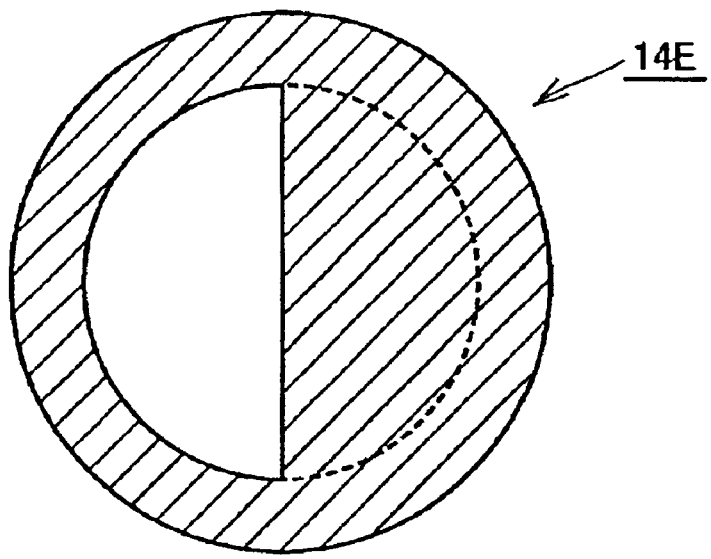
FIG. 16 shows the configuration of another illumination aperture used in the second exposure in the focus monitoring method according to the second embodiment of the present invention.

It is noted that, though in the description above, diaphragms 14B and 14C are used, each of which is the zonal illumination apperture stop of which a half side is concealed, the illumination aperture is not limited thereto. For example, the first exposure may be carried out using a diaphragm 14D in which one half side of a circular illumination apperture stop is concealed when the meridian plane is set as a border, as shown in FIG. 15, and thereafter the second exposure may be carried out using a diaphragm 14E in which the other half side of the circular illumination apperture stop is concealed when the meridian plane is set as a border, as shown in FIG. 16.

Figure 17:
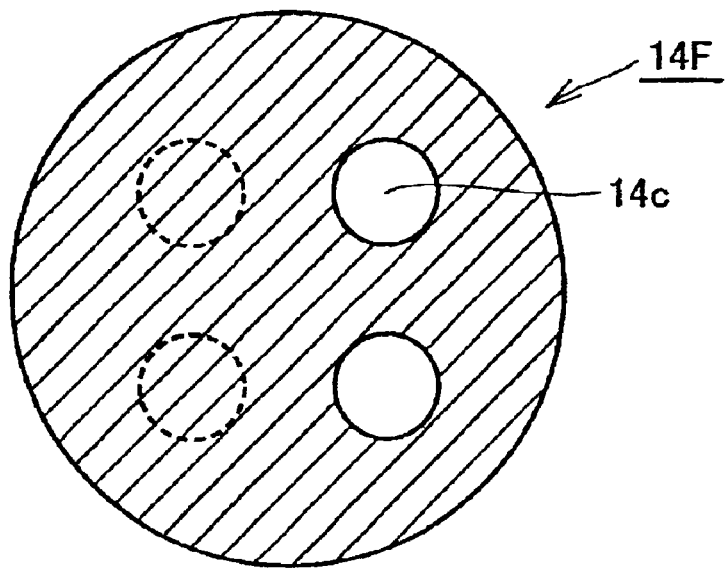
FIG. 17 shows the configuration of a further illumination aperture used in the first exposure in the focus monitoring method according to the second embodiment of the present invention.
Figure 18:
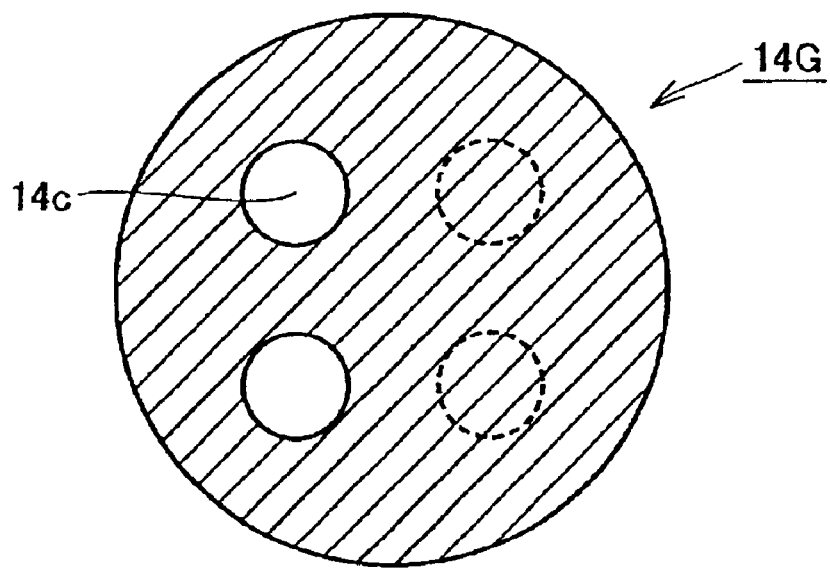
FIG. 18 shows the shape of a further illumination aperture used in the second exposure in the focus monitoring method according to the second embodiment.
Figure 19:
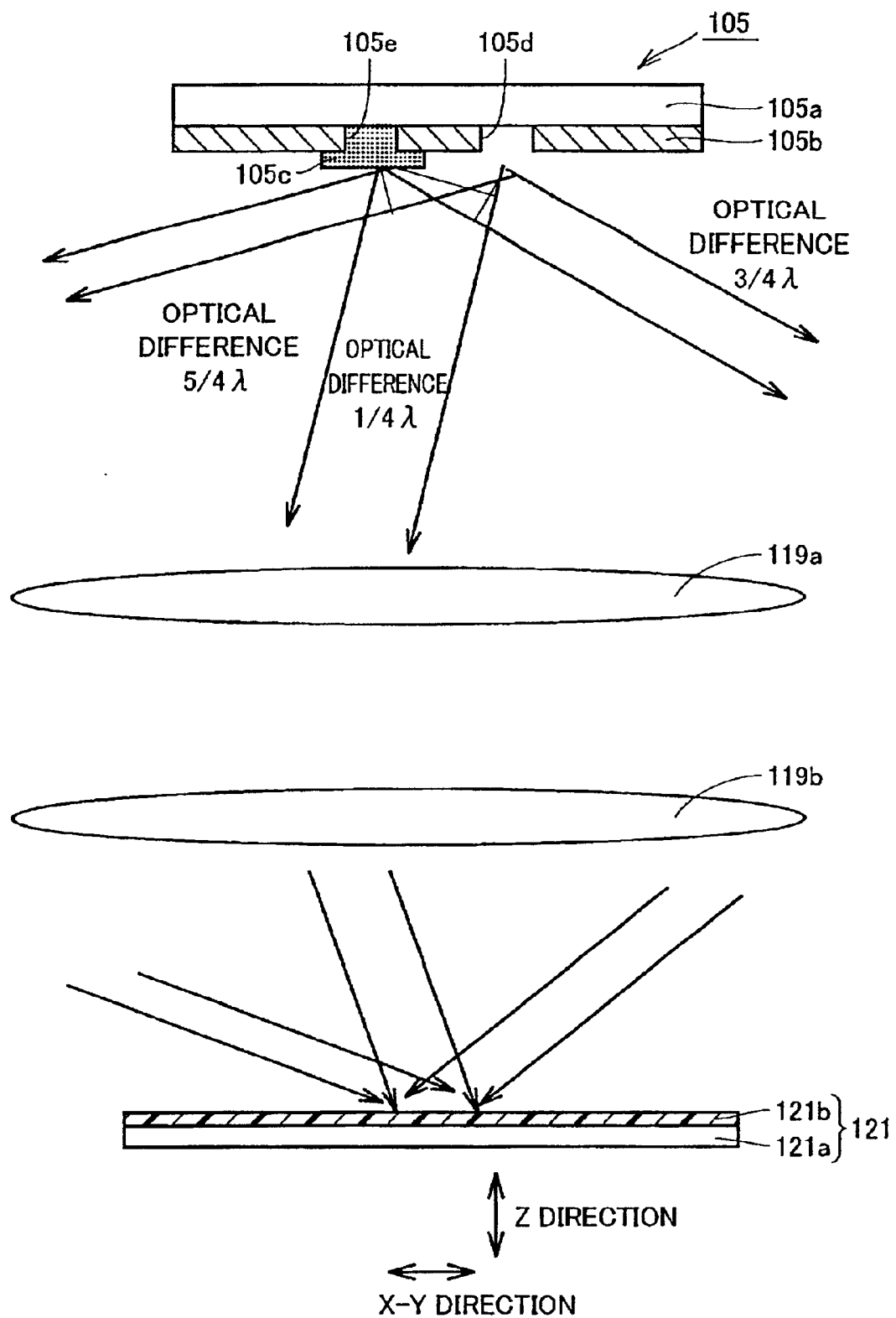
FIG. 19 illustrates the conventional phase shift focus monitoring method.
Figure 20:
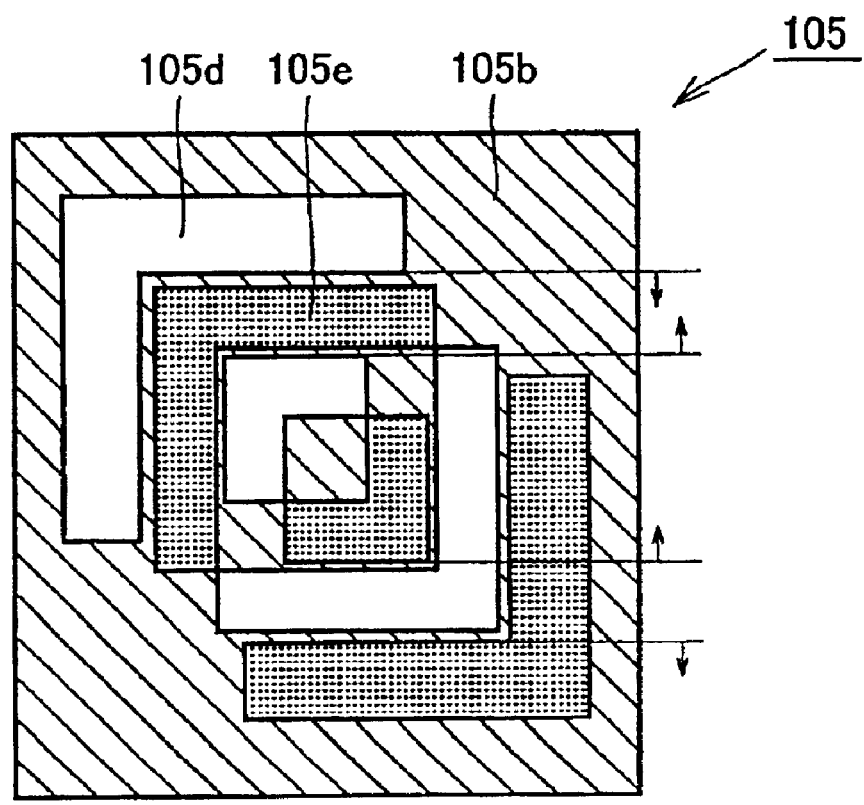
FIG. 20 shows the configuration of a photomask used in a phase focus monitor.
Figure 21:
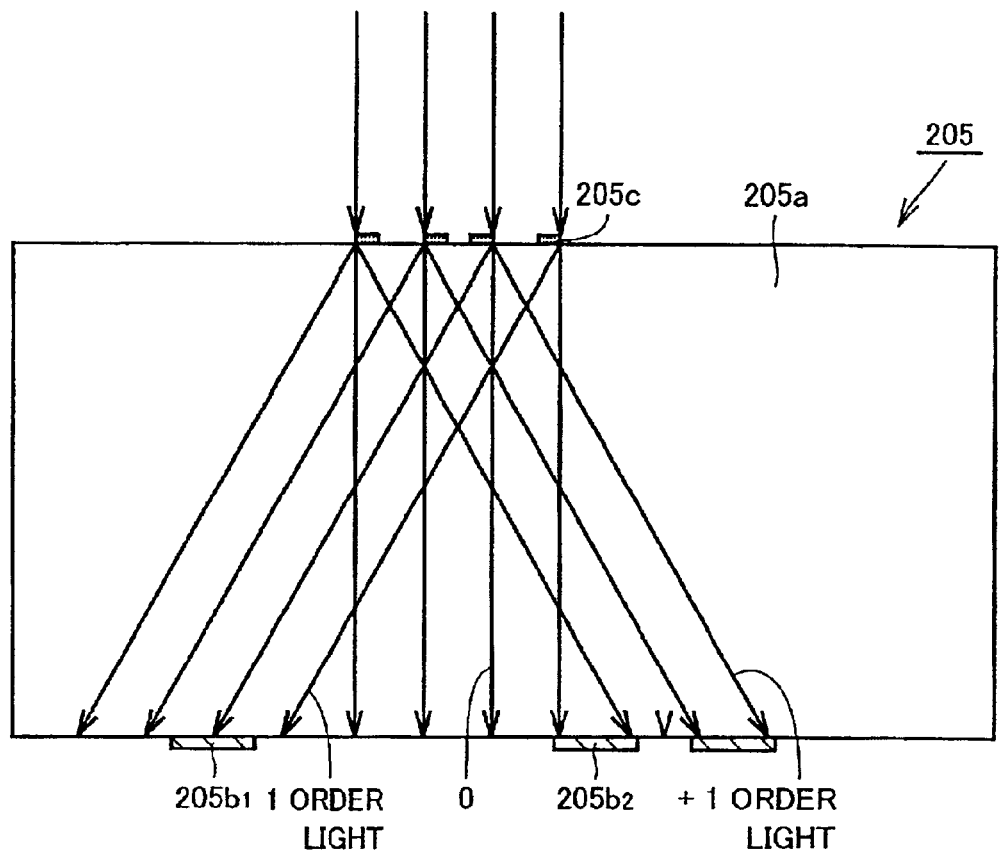
FIG. 21 is a schematic section view showing the configuration of the photomask used in the focus monitoring method disclosed in Japanese Patent Laying-Open No. 6-120116.

Moreover, the first exposure may be carried out using a diaphragm 14F in which one half side of a quadruple illumination apperture stop is concealed when a meridian plane is set as a border, as shown in FIG. 17, and thereafter the second exposure may be carried out using a diaphragm 14G in which the other half side of the quadruple illumination apperture stop is concealed when the meridian plane is set as a border, as shown in FIG. 18.

Note that, though a diaphragm is used as an illumination aperture in the first and second embodiments described above, the illumination aperture is not limited to a diaphragm, but lens or other optical members, except for the photomask, which can generate non-telecentric illumination by controlling the shape of an opening thereof (the shape of a light transmitting portion) may be applied to the present invention.

Though the second exposure is performed without development after the first exposure of photoresist 21b in the first embodiment, the photoresist may be developed after the first exposure shown in FIG. 6A, and thereafter the second exposure shown in FIG. 6B may be performed. In such a case, the photoresist is developed again after the second exposure.

Furthermore, a photoresist on the wafer surface is developed and patterned after exposure at the best focus obtained by the focus monitoring method in the first or second embodiment above, and the resist pattern is used to perform processes such as etching and ion implantation for an underlayer film, to precisely manufacture a desired semiconductor device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A focus monitoring method used for pattern formation of a semiconductor device, characterized in that
   light is directed onto a photomask by non-telecentric illumination obtained by controlling a shape of an opening of an illumination aperture, and such a characteristic is utilized to perform focus monitoring that a pattern image of said photomask formed by said illumination is moved in a direction perpendicular to an optical axis when an image-forming plane is moved in a direction of said optical axis.

2. The focus monitoring method according to claim 1, wherein a mark pattern of a box-in-box type having an outer box pattern and an inner box pattern is transferred onto a photoresist, and a relative displacement of said outer box pattern and said inner box pattern transferred onto said photoresist is detected, to perform focus monitoring.

3. The focus monitoring method according to claim 2, wherein said non-telecentric illumination is used for exposure of at least one of said outer box pattern and said inner box pattern.

4. The focus monitoring method according to claim 3, wherein
   said non-telecentric illumination is used for exposure of both of said outer box pattern and said inner box pattern,
   a first illumination aperture having an opening only on one side of a meridian plane set as a border is used at the time of exposure of said outer box pattern, and
   a second illumination aperture having an opening only on the other side of the meridian plane set as a border is used at the time of exposure of said inner box pattern.

5. The focus monitoring method according to claim 4, wherein
   one of a circular illumination apperture stop, an annular illumination apperture stop and a quadruple illumination apperture stop, with an opening left only on one side of the meridian plane set as a border, is used for said first illumination aperture, and
   one of a circular illumination apperture stop, an annular illumination apperture stop and a quadruple illumination apperture stop, with an opening left only on the other side of the meridian plane set as a border, is used for said second illumination aperture.

6. The focus monitoring method according to claim 2, comprising:
   a first exposure step exposing said photoresist to one of said outer box pattern and said inner box pattern;
   a second exposure step exposing said photoresist to the other one of said outer box pattern and said inner box pattern; and
   a development step developing said photoresist after said first and second exposure steps.

7. The focus monitoring method according to claim 2, comprising:
   a first exposure step exposing said photoresist to one of said outer box pattern and said inner box pattern;
   a first development step developing said photoresist after said first exposure step;
   a second exposure step exposing said photoresist to the other one of said outer box pattern and said inner box pattern; and
   a second development step developing said photoresist after said second exposure step.

8. A focus monitoring apparatus used for pattern formation of a semiconductor device, comprising:
   an illumination optical system illuminating a photomask on which a pattern is formed with exposure light; and
   a projection optical system projecting an image of the pattern of said photomask onto a photosensitive body,
   said image of the pattern of said photomask, formed by directing non-telecentric illuminating light obtained by controlling a shape of an opening of an illumination aperture included in said illumination optical system onto said photomask, being configured to move in a direction perpendicular to an optical axis when an image-forming plane is moved in a direction of said optical axis.

9. A method of manufacturing a semiconductor device, characterized in that the focus monitoring method according to claim 1 is used.

* * * * *